(12) United States Patent
Wipiejewski

(10) Patent No.: US 6,584,135 B2
(45) Date of Patent: Jun. 24, 2003

(54) VERTICAL CAVITY SURFACE EMITTING LASER DIODE AND METHOD FOR MANUFACTURING SAME

(75) Inventor: Torsten Wipiejewski, Santa Barbara, CA (US)

(73) Assignee: Osram Opto Semiconductors GmbH & Co. OHG, Regenburg (DE)

( * ) Notice: Subject to any disclaimer, the term of this patent is extended or adjusted under 35 U.S.C. 154(b) by 0 days.

(21) Appl. No.: 09/865,097

(22) Filed: May 24, 2001

(65) Prior Publication Data

US 2002/0003822 A1 Jan. 10, 2002

(30) Foreign Application Priority Data

May 26, 2000 (DE) ......................... 100 26 262

(51) Int. Cl.[7] ................................. H01S 3/08
(52) U.S. Cl. ..................... 372/96; 372/46; 372/45
(58) Field of Search ............... 372/45, 46, 96; 174/261; 250/221; 437/129

(56) References Cited

U.S. PATENT DOCUMENTS

| 5,115,441 A | * | 5/1992 | Kopf et al. ................... 372/45 |
| 5,397,739 A | * | 3/1995 | Chalmers et al. ............ 437/129 |
| 5,493,577 A | * | 2/1996 | Choquette et al. ............ 372/46 |
| 5,530,715 A | * | 6/1996 | Shieh et al. .................... 372/96 |
| 5,903,588 A | | 5/1999 | Guenter et al. |
| 6,002,705 A | | 12/1999 | Thornton |
| 6,166,334 A | * | 12/2000 | Galloway ..................... 174/261 |
| 6,317,446 B1 | * | 11/2001 | Wipiejewski ................. 372/46 |
| 2001/0035492 A1 | * | 11/2001 | Esteves-Garcia ............ 250/221 |

FOREIGN PATENT DOCUMENTS

| WO | WO 99/53578 | 10/1999 |
| WO | WO 00/30226 | 5/2000 |

* cited by examiner

*Primary Examiner*—Paul Ip
*Assistant Examiner*—Tuan Nguyen
(74) *Attorney, Agent, or Firm*—Schiff Hardin & Waite

(57) ABSTRACT

A vertical resonator structure with active layer and Bragg reflectors formed in a mesa and provided with an upper contact and a substrate contact. A bond pad for connection to a housing and the upper contact are parts of the same metallization layer that are directly adjacent to one another. For bundling current in the active layer, an aperture can be formed between oxidized regions of an AlGaAs layer. The oxidized regions have at least the dimensions of the bond pad which are for example, 90 μm and at least approximately 50 μm.

11 Claims, 2 Drawing Sheets

VERTICAL CAVITY SURFACE EMITTING LASER DIODE AND METHOD FOR MANUFACTURING SAME

BACKGROUND OF THE INVENTION

1. Field of the Invention

The present invention is directed to vertical resonator laser diodes (vertical cavity surface emitting laser diode).

2. Discussion of the Related Art

Vertical resonator laser diodes (VCSELs) have a number of advantages over traditional laser diodes with longitudinal resonator. These include, low beam divergence which is advantageous for a number of applications, such as fast optocouplers, sensors, encoders. In the standard embodiments of a VCSEL, the vertical resonator is often produced in a mesa structure, whereby a metallic contact for the current injection is located on the surface of the mesa. In order to electrically connect the VCSEL chip with a housing, a metallic surface is additionally applied on the component as a terminal contact surface (bond pad), this being electrically connected to the mesa contact. At least three mask levels are required for manufacturing this conductive connection between the contacts, particularly in the manufacture of 850 nm VCSELs on GaAs substrates that emit toward the overgrowth side of the substrate. This represents a considerable manufacturing outlay and, thus, a critical cost factor.

In the inventive VCSEL, a vertical resonator structure in a mesa having a contact applied on the top side. A contact surface (bond pad) provided for external electrical connection, particularly for the electrical connection to a housing, is located on the same top side in the proximity of the contact and is preferably fashioned lying completely on one side of the contact. The bond pad, just like the contact, can be directly electrically conductively connected to the semiconductor layer to be contacted, in that a low-impedance metal-semiconductor contact is also formed between the bond pad and this semiconductor layer. In an especially preferred development, the contact and the bond pad are parts of the same electrically conductive contacting layer, preferably a metallization layer. Thus, these parts immediately adjoin one another and can be identified as contact and or bond pad by their position with reference to the planned radiation emission and by their geometrical dimensions.

The current bundling in the active layer needed for an efficient laser operation can be achieved with an aperture that electrically insulates a region lying outside the predetermined current path. Such an aperture can be formed by a lateral oxidation of one or more oxidizable semiconductor layers in the layer structure. For example, a semiconductor material suitable for this purpose is AlGaAs. An aperture layer composed of such a material can be oxidized down into a predetermined depth proceeding from the sidewall of a mesa structure formed by the layer structure, namely to such an extent into the mesa, that the projection of the bond pad perpendicular to the layer planes lies in the insulating region of the layer. The current path is thus constricted onto the region of the perpendicular projection of the contact. Consequently, the bond pad serves only for the external electrical connection without influencing the current injection, which allows an arrangement of the bond pad that is laterally adjacent to the contact but asymmetrical relative to the center of the radiation emission. The preferred embodiment of the inventive VCSEL therefore differs from traditional VCSELs in terms of the lateral dimension of the insulating region round about the aperture. This insulating region has a larger dimension in a radial direction of the mesa, i.e. in the layer plane from the center to the sidewall of the mesa, than that of a typical dimension of the bond pad of, for example, 90 $\mu$m and at least approximately 50 $\mu$m.

SUMMARY OF THE INVENTION

It is an object of the present invention to provide a VCSEL and a method of making it, having a top-side contact and a bond pad for external electrical connection of the contact, that is significantly easier to manufacture compared to traditional embodiments.

It is another object of the invention to provide a VCSEL and a method of making it, having a larger dimension in the layer plane from the center of the sidewall of the mesa.

It is a further object of the invention to provide a VCSEL and a method of making it, having a bond pad that serves only for the external electrical connection without influencing the current junction.

DETAILED DESCRIPTION OF THE PREFERRED EMBODIMENTS

Figure 1:
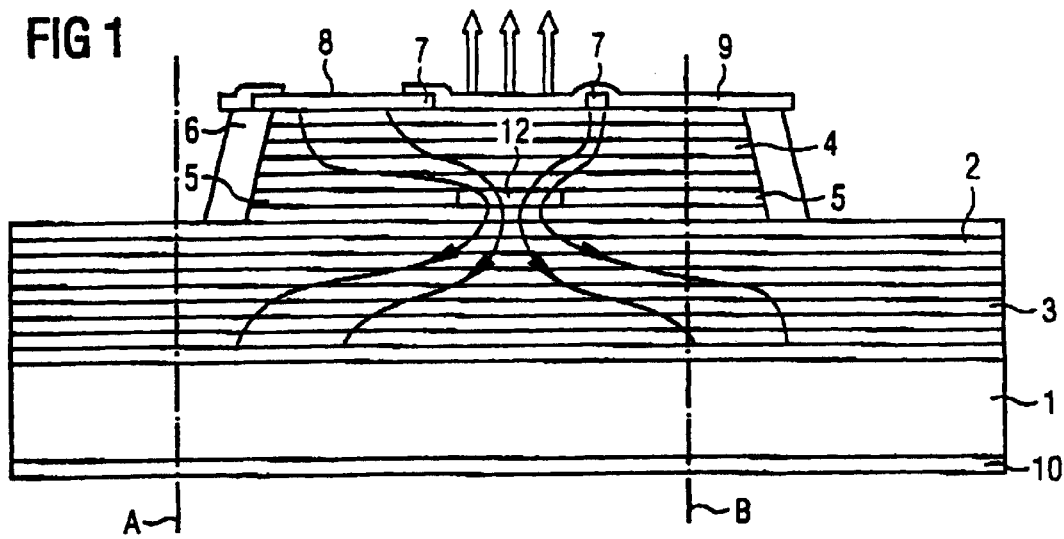
FIG. 1 shows an embodiment of the present invention in cross section.

FIG. 1 shows a cross section of a VCSEL, having an active layer 2 provided for generating radiation on a substrate in a known way, arranged in a vertical resonator fashioned between a first reflector 3 and a second reflector 4. The reflectors 3, 4 are distributed Bragg reflectors (DBRs).

An aperture layer 5 arranged in the second reflector 4 in the proximity of the active layer 2 serves the purpose of forming an aperture that is provided for limitation of the current. The second reflector and the aperture layer are arranged in a mesa provided with a sidewall passivation 6. Which of the layers 2, 5 are present in the mesa and which are present surface-wide on the substrate is not defined in the inventive VCSEL. In particular, the chip containing the VCSEL can be laterally sawn or etched to the dimensions of the mesa, so that a step is not formed by the mesa.

Usually with the exception of the intrinsically conductive active layer, the semiconductor material of these layers 2, 5 is electrically conductively doped, so that the active layer 2 is arranged between semiconductor materials of two conductivity types of mutually opposite operational sign. The substrate 1, including the first reflector 3 and buffer layers, cladding layers or confinement layers that may potentially be present are, for example, n-conductively doped, whereas the semiconductor material at the opposite side of the active layer 2 is, for example, p-conductively doped.

For the purpose of current injection, a contact of metal, which is preferably applied onto a highly doped semiconductor material for formation of a low-impedance metal-semiconductor contact, is located on the semiconductor materials of different conductivity types. A substrate contact 10, can be replaced by a contact that is applied to the side of the mesa at the opposite side of the mesa that is electrically connected to the semiconductor material at that side of the active layer facing toward the first reflector.

A ring contact 7 leaves the upper side of the mesa free in its inner recess, is located on that side of the active layer facing away from the substrate and is provided for the exit of generated radiation. Thus, radiation emerges from the semiconductor material according to the upwardly directed arrows. Use of the ring contact 7 is especially expedient because the contact 7 is a portion of a metallization layer. However, the geometrical shape of the contact, is not fixed. Instead, the contact 7 can form an interconnected region without the inner recess, and can be composed of an electrically conductive material that is transparent for the wavelength of the generated radiation. A transparent substrate can likewise be used and exit of the radiation can be provided at the side of the substrate. Thus, a contact 7 not having an inner recess composed of an opaque material can be used.

What is critical for the inventive VCSEL is that the contact 7 constitute a portion of a contacting layer comprising a portion provided as bond pad 8 for an electrical connection to the outside. The top side provided with the contact 7 and the bond pad 8 can be covered with a passivation layer 9, such as $Al_2O_3$, or another transparent material and preferably leave free only the bond pad 8 for external connection.

Aperture layer 5 is used in the exemplary embodiment shown in FIG. 1 in order to form an aperture 12 for constricting the current.

Aperture layer 5 is an oxidizable semiconductor material, such as AlGaAs, that can be oxidized into a predetermined depth proceeding from the sidewall of the mesa. Thus, the lateral parts of the aperture layer 5 entered in FIG. 1 become electrically insulating and constrict the current path according to the curved arrows. At the same time, sidewall passivation 6 is obtained when the other semiconductor layers of the mesa are also oxidizable but have a lower oxidation rate. In the example of AlGaAs, this can be set by the aluminum part of the mixed crystal composition.

Figure 2:
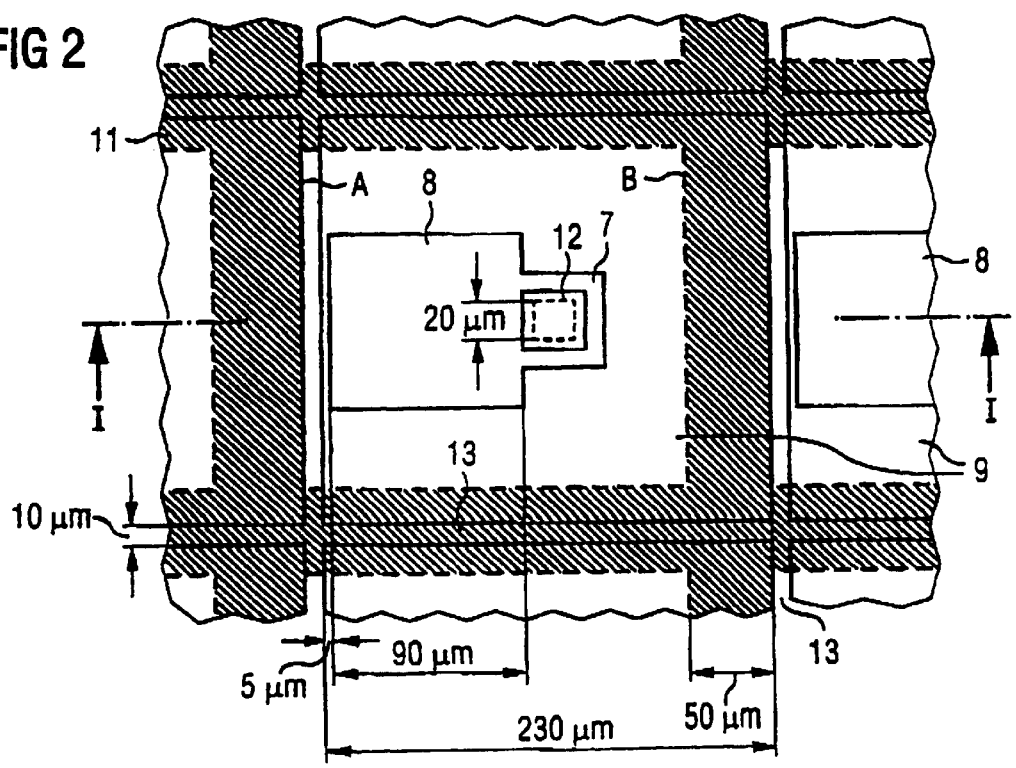
FIG. 2 shows the embodiment of FIG. 1 in plan view.

FIG. 2 shows the exemplary embodiment of FIG. 1 in a plan view, illustrating how the components can be manufactured on a wafer and separated. The dimensions that have been entered are typical examples. Etched trenches 13 have a typical width of 10 µm and are located between the components in the semiconductor material not covered by the contacting layer or the passivation layer 9. Mesas of the individual components are located between said trenches 13. Lateral dimension of the mesas amounts to 230 µm, as defined by the spacing of successive trenches. A stripe typically measuring about 50 µm wide and removed when the wafer is sawn, is shown as parting region 11.

In FIG. 2, passivation layer 9, which preferably leaves only the bond pad 8 free but otherwise covers the entire surface of the respective mesa, is shown transparent, so that the structure and position of the contact 7 can be seen. The covered contours of the aperture 12 are likewise shown for orientation. In this example, the mesa is quadratically structured, the aperture is quadratic and has a side length of 20 µm.

Contact 7 is shown as a quadratic frame in FIG. 2. However, contact 7 can be fashioned as an annulus, particularly in conjunction with a mesa shaped like a truncated pyramid. Bond pad 8, shown as a quadratic in FIG. 2 with a side length of 90 µm, directly adjoins the contact 7 but can be clearly delimited therefrom. The boundary between contact 7 and bond pad 8 proceeds along the straight line defined by the right-hand edges of the bond pad 8 that are entered at both sides of the contact 7.

Without interconnects or the like arranged therebetween, an annularly shaped contact 7 could merge into the bond pad 8, such that the exact course of the boundary line is trivial, since the contact 7 and the bond pad 8 can be kept apart on the basis of either their respective function either for injecting current or for external connection during operation. In the case of contact 7 not having an inner recess, the contact 7 and the bond pad 8 can be distinguished from one another on the basis either of the localization of the radiation emission or of the aperture, and on the basis of the position of the external connection. What is critical is that contact 7 and bond pad 8 are present in the same contact layer in extremely close proximity to one another and preferably adjoining one another.

A method for manufacturing a VCSEL according to the present invention comprises applying a contacting layer on a mesa in which the layer structure of the vertical resonator is formed. A metallization layer is deposited as the contacting layer and is structured with lift-off technique or by etching using a mask.

Figure 3:
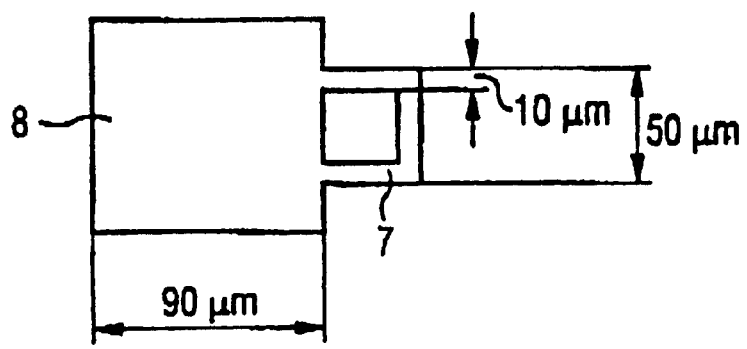
FIG. 3 shows an example of a structure of the metallization layer forming the contact and the bond pad of the present invention.

In the illustrated exemplary embodiment, the structure defined by the mask corresponds to the field shown as cross-hatching in FIG. 3.

Contact 7 occupies a quadratic region with a side length of 50 µm, and has a quadratic recess with the side length 30 µm. Bond pad 8 following thereupon is quadratic with a side length of 90 µm. Given the structure illustrated in FIG. 3 and the indicated dimensions, an overlap exists between the portions of the metallization layer defined as contact 7 and as bond pad 8.

However, an exact demarcation of the portions is of no concern since what is critical for the inventive VCSEL and its method of manufacture is that contact 7 and bond pad 8 are portions of a common contacting layer that can be structured in a single method step using only one mask.

Figure 4:
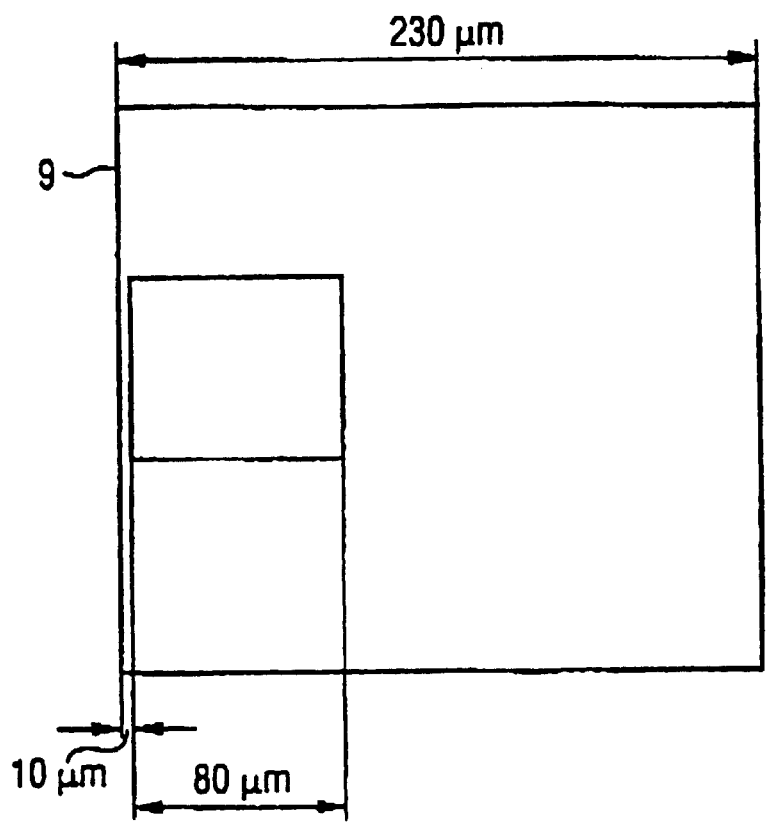
FIG. 4 shows an example of the structure of a top side passivation of the present invention.

Passivation layer 9 is applied according to the structure shown in FIG. 4 using a further mask. Passivation layer 9 comprises an optically transparent material and has an opening, which is quadratic with a side length of 80 µm in this example, only in the region of bond pad 8. Structuring of passivation layer 9 can also be done using a lift-off technique or by etching using a further masks serves this purpose.

A structure is thus generated wherein the surface of the semiconductor material, except for narrow, crossing strips, is completely covered by the contacting layer or by the passivation layer 9. As shown in FIG. 2 the region of the semiconductor material not covered is subsequently removed by wet-chemical or dry-chemical etching, so that trenches 13 are etched between the semiconductor material that remains standing as mesas.

Etching depth is selected such that the aperture layer 5 of AlGaAs destined for oxidation is uncovered at the edges. In the preferred embodiment, layer 5 is arranged immediately above the active layer in the second (upper) reflector 4, so that the active layer, including any confinement or cladding layers, need not be etched.

Uncovered regions of the aluminum-containing semiconductor layers are then oxidized at approximately 400 C. in an atmosphere saturated with water vapor. One or more semiconductor layers provided as aperture layer 5 are given a greater amount of aluminum or are formed with a greater layer thickness than the other AlGaAs layers. Thus, a higher oxidation rate is achieved thereat and the aperture is formed in the illustrated shape, such that only the significantly more lightly oxidized sidewall passivation 6 of the mesas is generated. Substrate contact 10 is applied as backside metallization.

For separating the components into individual chips, the wafer can be sawn in the parting regions 11 shown in FIG. 2, which also comprise an edge region of the mesas when a small grid arrangement of the components on the wafer is wanted.

Specifically marked regions A and B of the parting regions shown in FIG. 2 proceed in the vertical direction, roughly along the dot-dashed lines A and B shown in FIG. 1.

Although modifications and changes may be suggested by those skilled in the art to which this invention pertains, it is the intention of the inventors to embody within the patent warranted hereon all changes and modifications that may reasonably and properly issue under the scope of their contribution to the art.

What is claimed is:

1. A vertical cavity surface emitting laser diode (VCSEL), comprising:
   a first reflector provided for fashioning a vertical resonator;
   a second reflector;
   an active layer configured between the first reflector and the second reflector; and
   an electrically conductive contacting layer comprising at least one contact on a top side of the VCSEL provided for radiation exit, the at least one contact being configured for an injection of current, the contact comprising a bond pad for electrical connection.

2. The vertical cavity surface emitting laser diode according to claim 1, wherein the contacting layer is a metallization layer and the contact comprises a ring contact portion having a hole that leaves a region of the appertaining top side for radiation exit.

3. The vertical cavity surface emitting laser diode according to claim 2, whereby the contact and the bond pad are adjacent to one another.

4. The vertical cavity surface emitting laser diode according to claim 3, whereby the bond pad is arranged at one side of a straight line proceeding through a region of the appertaining top side provided for radiation exit.

5. The vertical cavity surface emitting laser diode according to claim 4, whereby the bond pad is connected to a bond wire or to a bond pad of a housing, and the contact is electrically connected only to the bond pad and to semiconductor material.

6. The vertical cavity surface emitting laser diode according to claim 5, whereby an aperture is present that effects a bundling of an electrical current onto a region outside a perpendicular projection of the bond pad with reference to the active layer.

7. The vertical cavity surface emitting laser diode according to claim 6, whereby the aperture is formed in an aperture layer comprising an electrically insulating region.

8. The vertical cavity surface emitting laser diode according to claim 7, whereby the aperture layer is an oxidizable semiconductor material, and the electrically insulating region is formed by oxidizing semiconductor material of the aperture layer.

9. The vertical cavity surface emitting laser diode according to claim 8, whereby the electrically insulating region of the aperture layer comprises at least a perpendicular projection of the bond pad.

10. The vertical cavity surface emitting laser diode according to claim 9, whereby the bond pad comprises dimensions of at least respectively 50 $\mu$m in two perpendicular directions relative to one another within the bond pad.

11. The vertical cavity surface emitting laser diode according to claim 9, whereby the bond pad comprises dimensions of at least respectively 90 $\mu$m in two perpendicular directions relative to one another within the bond pad.

* * * * *